(12) United States Patent
Miller et al.

(10) Patent No.: US 8,900,427 B2
(45) Date of Patent: Dec. 2, 2014

(54) HOMING DEVICE FOR MAGNETRON ROTATING ON TWO ARMS

(75) Inventors: Keith A. Miller, Sunnyvale, CA (US); Michael Allen Flanigan, Dutch Flat, CA (US); Hari Ponnekanti, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/213,367

(22) Filed: Aug. 19, 2011

(65) Prior Publication Data

US 2011/0297538 A1    Dec. 8, 2011

Related U.S. Application Data

(60) Division of application No. 11/924,573, filed on Oct. 25, 2007, now Pat. No. 8,021,527, which is a continuation-in-part of application No. 11/226,858, filed on Sep. 14, 2005, now Pat. No. 7,736,473.

(60) Provisional application No. 60/910,537, filed on Apr. 6, 2007.

(51) Int. Cl.
C23C 14/35    (2006.01)
H01J 37/34    (2006.01)

(52) U.S. Cl.
CPC ......... H01J 37/3408 (2013.01); H01J 37/3455 (2013.01)
USPC ............... 204/298.2; 204/298.16; 204/298.19

(58) Field of Classification Search
USPC .............................. 204/298.2, 298.16, 298.19
See application file for complete search history.

(56) References Cited

U.S. PATENT DOCUMENTS

| | | | |
|---|---|---|---|
| 4,714,536 A * | 12/1987 | Freeman et al. | 204/298.2 |
| 5,171,415 A | 12/1992 | Miller et al. | |
| 5,762,766 A | 6/1998 | Kurita et al. | |
| 5,944,968 A | 8/1999 | Kobayashi et al. | |
| 6,228,236 B1 | 5/2001 | Rosenstein et al. | |
| 6,841,050 B2 | 1/2005 | Hong et al. | |
| 6,852,202 B2 | 2/2005 | Miller et al. | |
| 8,721,847 B2 | 5/2014 | Chang et al. | |
| 2003/0136901 A1 * | 7/2003 | Ohtomo et al. | 250/234 |
| 2003/0217914 A1 * | 11/2003 | Miller et al. | 204/192.12 |
| 2004/0050690 A1 | 3/2004 | Green et al. | |
| 2005/0211548 A1 | 9/2005 | Gung et al. | |

OTHER PUBLICATIONS

U.S. Appl. No. 13/347,030, filed Jan. 10, 2012, allowed claims.

* cited by examiner

Primary Examiner — Jason M Berman
(74) Attorney, Agent, or Firm — Charles S. Guenzer

(57) ABSTRACT

A magnetron actuator for moving a magnetron in a nearly arbitrary radial and azimuthal path in the back of a target in a plasma sputter reactor. The magnetron includes two coaxial rotary shafts extending along the chamber central axis and coupled to two independently controllable rotary actuators. An epicyclic gear mechanism or a frog-leg structure mechanically couple the shafts to the magnetron to control its radial and azimuthal position. A vertical actuator moves the shafts vertically in tandem to vary the magnetron's separation from the target's back surface and compensate for erosion of the front surface. The rotary actuators may be separately coupled to the shafts or a rotatable ring gear may be coupled to the shafts through respectively fixed and orbiting idler gears. Two radially spaced sensors detect reflectors attached to the inner and outer arms of the epicyclic gear mechanism for homing of the controller.

22 Claims, 8 Drawing Sheets

HOMING DEVICE FOR MAGNETRON ROTATING ON TWO ARMS

RELATED APPLICATION

This application is a division of Ser. No. 11/924,573, filed Oct. 25, 2007, now issued as U.S. Pat. No. 8,021,527, and incorporated herein by reference, which claims benefit of provisional application 60/910,537, filed Apr. 6, 2007, and is a continuation in part of Ser. No. 11/226,858, filed Sep. 14, 2005 and now issued as U.S. Pat. No. 7,736,473.

FIELD OF THE INVENTION

The invention relates generally to sputtering of materials. In particular, the invention relates to a magnetron rotating with variable radius.

BACKGROUND ART

Sputtering, alternatively called physical vapor deposition (PVD), has long been used in depositing metals and related materials in the fabrication of semiconductor integrated circuits. Its use has been extended to depositing metal layers onto the sidewalls of high aspect-ratio holes such as vias or other vertical interconnect structures. Currently, advanced sputtering applications include depositing a copper seed layer for later electroplating of copper in the via and depositing a barrier layer, such as tantalum and its nitride, on the dielectric material of the via sidewall to prevent the copper from diffusing into the dielectric.

Plasma sputtering typically includes a magnetron positioned at the back of the sputtering target to project a magnetic field into the processing space to increase the density of the plasma and enhance the sputtering rate. Typically, the magnetron is rotated about the center of the circular target to provide a more uniform erosion pattern of the target and deposition profile on the circular wafer.

Sputtering into high aspect-ratio vias has prompted further modifications in the magnetron which promotes the ionization of a large fraction of the sputtered atoms. If the wafer is electrically biased, the sputtered ions are accelerated in nearly vertical trajectories to reach deeply within the vias. The ionization fraction of sputtered atoms is increased if the magnetron is relatively small so that the target power is effectively concentrated in a small fraction of the target area adjacent the small magnetron. However, very small magnetrons rotating about a target center introduce two problems. For copper sputtering especially, target utilization and radial deposition uniformity are reduced if the magnetron is rotating along a fairly narrow annular band and promoting sputtering only within that band. For tantalum sputtering, it seems acceptable to sputter only the outer peripheral band of the target because the tantalum ions tend to diffuse toward the center during their passage to the wafer. However, some of the sputtered tantalum tends to redeposit on the target. In the unsputtered central area of the target, the redeposited tantalum, often in nitride form, forms a growing layer of poorly adhering material. Eventually, the redeposited material flakes off and create a significant particle problem.

Miller et al. in U.S. Pat. No. 6,852,202 describe a planetary magnetron executing a regular epicyclic pattern at the back of the target, thereby increasing the sputtering uniformity. An epicyclic pattern is obtained which combines rotation of the magnetron about an axis that is itself rotating about a central axis. In a regular epicyclic pattern the two rotation rates are constant such as the moon orbits the earth and the earth orbits the sun with two orbital periods with a constant proportionality between them. Typically, the rotation rates are constant over the entire active scan. On the other hand, a general epicyclic pattern can still be characterized as a two-stage rotation of the magnetron but the two orbital periods do not necessarily have a fixed ratio.

Rosenstein et al. in U.S. Pat. No. 6,228,236 and Pavloff in U.S. patent application Ser. No. 11/553,880, filed Oct. 27, 2006 and now published as U.S. patent application publication 2008/0099329 disclose magnetrons which rotate at two different radii when rotated in opposite directions. This dual operation allows sputtering depositing on the wafer at one magnetron radius and cleaning the target at a second magnetron radius while the wafer is removed from the chamber. The required reversal of rotation, however, is inconvenient. Gung et al. in U.S. patent application publication 2005/0211548 disclose a centrifugal mechanism for switching between two rotation radii dependent upon the rotation speed. Miller et al. in U.S. patent application publication 2006/007623, the parent application of this continuation in part and incorporated herein by reference, disclose mechanisms for the continuous variability of the magnetron radius.

In U.S. patent application publication 2005/1013365, Hong et al. have disclosed a mechanism for vertically moving a planetary magnetron to compensate for target erosion.

SUMMARY OF THE INVENTION

A magnetron for plasma sputtering is scanned in a radial and circumferential or azimuthal path with respect to a central axis about the back of a sputter target by two coaxial rotary shafts, each controlled by an independent rotary drive source. The two shafts may move the magnetron within a liquid-cooling reservoir at the back of the target. Motors driving the rotary shafts may be positioned outside the reservoir and be sealed on the reservoir wall by rotary seals.

In one embodiment, an epicyclic mechanism includes a sun gear fixed to one rotary shaft and inner arm fixed to the other rotary shaft and supporting a follower gear mechanically coupled to the sun gear. A outer arm is fixed to the follower gear and includes a mount at one end for supporting the magnetron.

In another embodiment, a frog-leg mechanism has two inner arms respectively fixed to the two rotary shafts. Two outer arms are pivotally connected on inner ends to inner arms and are coupled together at their outer ends to support the mount for the magnetron.

In one embodiment, the shafts are coupled by belts or gears to rotary outputs of respective motors.

In another embodiment, one actuator rotates a ring gear having an inner toothed surface. At least one first idler gear, which may be fixed, couples the ring gear to one rotary shaft. At least one second gear mounted on a rotatable epicyclic carrier couples the ring gear to the other rotary shaft. The other actuator rotates the epicyclic carrier about the common axis of the rotary shafts.

Advantageously, a vertical actuator moves both rotary shafts along the common axis. For example, the vertical actuator vertically moves a frame supporting the two actuators and the two rotary shafts.

DETAILED DESCRIPTION OF THE PREFERRED EMBODIMENTS

Figure 1:
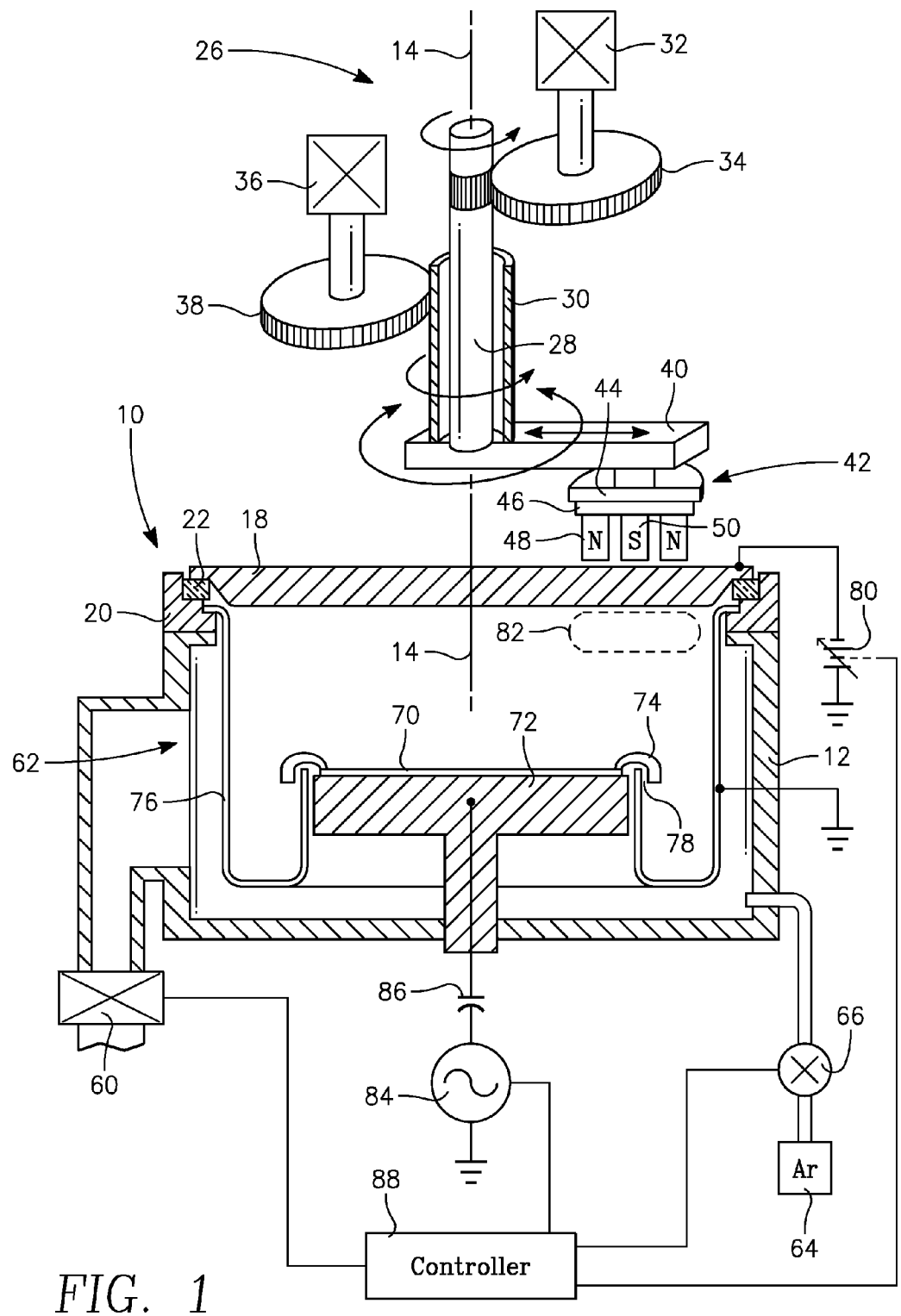
FIG. 1 is a schematic illustration partial sectioned and partially in elevation and orthographic view of a sputter chamber incorporating the invention.

A sputter chamber 10 schematically illustrated in the cross-sectional view of FIG. 1 includes a conventional main chamber 12 generally symmetric around a central axis 14 and supporting a target 18 through an adapter 20 and an isolator 22. The target 18 may be formed from the material to be sputtered or may include a target tile facing the interior of the chamber body 12 and bonded to a backing plate extending laterally over the isolator 22. The sputter chamber 10 also includes an epicyclic scan actuator 26 located in the back of the target 18 and including an inner rotary shaft 28 and a tubular outer rotary shaft 30, which are coaxial and are arranged about and extend along the central axis 14 and can rotate about it. A first motor 32 is coupled to the inner rotary shaft 28 by a drive gear 34 or other mechanical means such as a belt wrapped around two pulleys to rotate it. A second motor 36 is similarly coupled to the outer rotary shaft 30 through another drive gear 38 or mechanical means to rotate it independently of the rotation of the inner rotary shaft 28. The shafts 28, 30 are coupled to an epicyclic mechanism 40, two embodiments of which will be described in detail later, which supports a magnetron 42 through a mount 44 and scans it over the back of the target 18 in a nearly arbitrary pattern. The magnetron 42 typically includes a magnetic yoke 46 supporting and magnetically coupling an inner pole 48 of one magnetic polarity along the central axis 14 and an outer pole 50 of the opposed magnetic polarity and surrounding the inner pole 48.

Returning to the main chamber 12, a vacuum pump 60 pumps the interior of the main chamber 12 through a pumping port 62. A gas source 64 supplies a sputter working gas, such as argon, into the chamber 12 through a mass flow controller 66. If reactive sputtering is desired, for example, of a metal nitride, a reactive gas, such as nitrogen in the example, is also supplied.

A wafer 70 or other substrate is supported on a pedestal 72 configured as an electrode in opposition to the target 18. A wafer clamp ring 74 may be used to hold the wafer 70 to the pedestal 72 or to protect the pedestal periphery. However, many modern reactors use electrostatic chucks to hold the wafer 70 against the pedestal 72. An electrically grounded shield 76 supported on the adapter 20 protects the chamber walls and sides of the pedestal 72 from sputter deposition and also acts as an anode in the plasma discharge. The working gas enters the main processing area through a gap 78 between the clamp ring 74 or pedestal 72 and the shield 76. Other shield configurations may include an electrically floating secondary shield inside the primary shield 76 and perforations through portions of the primary shield 76 protected by the secondary shield to promote gas flow into the processing area.

A DC power supply 80 negatively biases the target 18 with respect to the grounded shield 76 and causes the argon working gas to be excited and discharge into a plasma. The magnetron 42 concentrates the plasma and creates a high density plasma (HDP) region 82 underneath the magnetron 42 inside the main chamber 12. The positively charged argon ions are attracted to the target 18 with sufficient energy to sputter the metal from the target 18. The sputtered metal deposits on and coats the surface of the wafer 70. Preferably for deep hole filling, an RF power supply 84 is connected to the pedestal electrode 72 through a capacitive coupling circuit 86, which acts as a high-pass filter, to create a negative DC self bias on the wafer 70. The self bias is effective at accelerating positive metal ions or possibly argon ions toward the wafer 70 in perpendicular trajectories that more easily enter high-aspect holes. The self bias also imparts a high energy to the ions, which may be controlled to differentiate sputter deposition on the wafer 70 and sputter etching of the wafer 70. A computer-based controller 88 controls the vacuum pump 60, the argon mass flow controller 66, the power supplies 80, 84 and the drive circuits for the magnetron motors 32, 36 according to the desired sputtering conditions and scan patterns as input to the controller 88 through a recordable medium such as a CDROM inserted into it.

Figure 2:
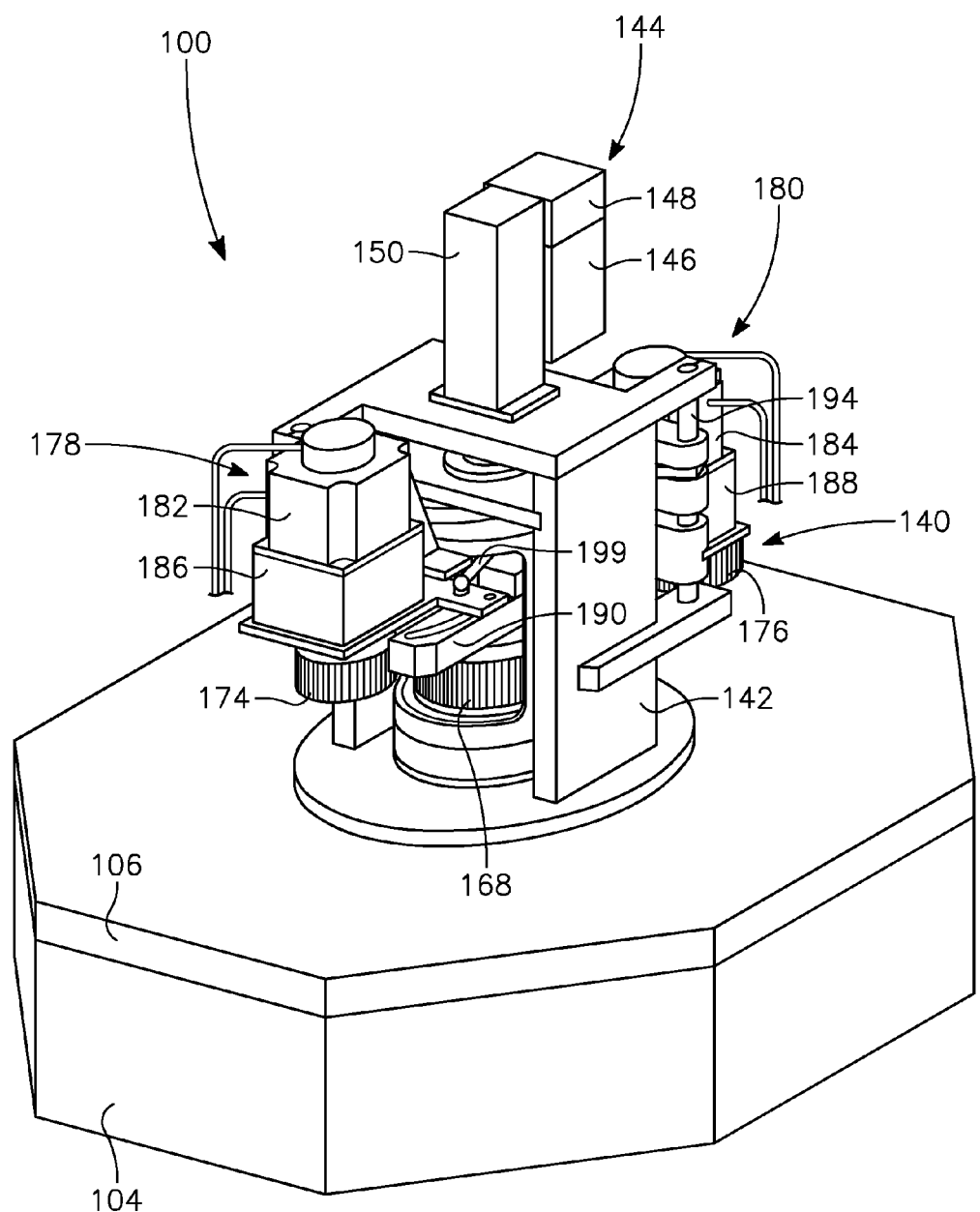
FIG. 2 is an orthographic view of a sputtering source assembly usable with the sputter chamber of FIG. 1 and including two rotary and one vertical actuator controlling the position of a magnetron through an epicyclic mechanism.
Figure 3:
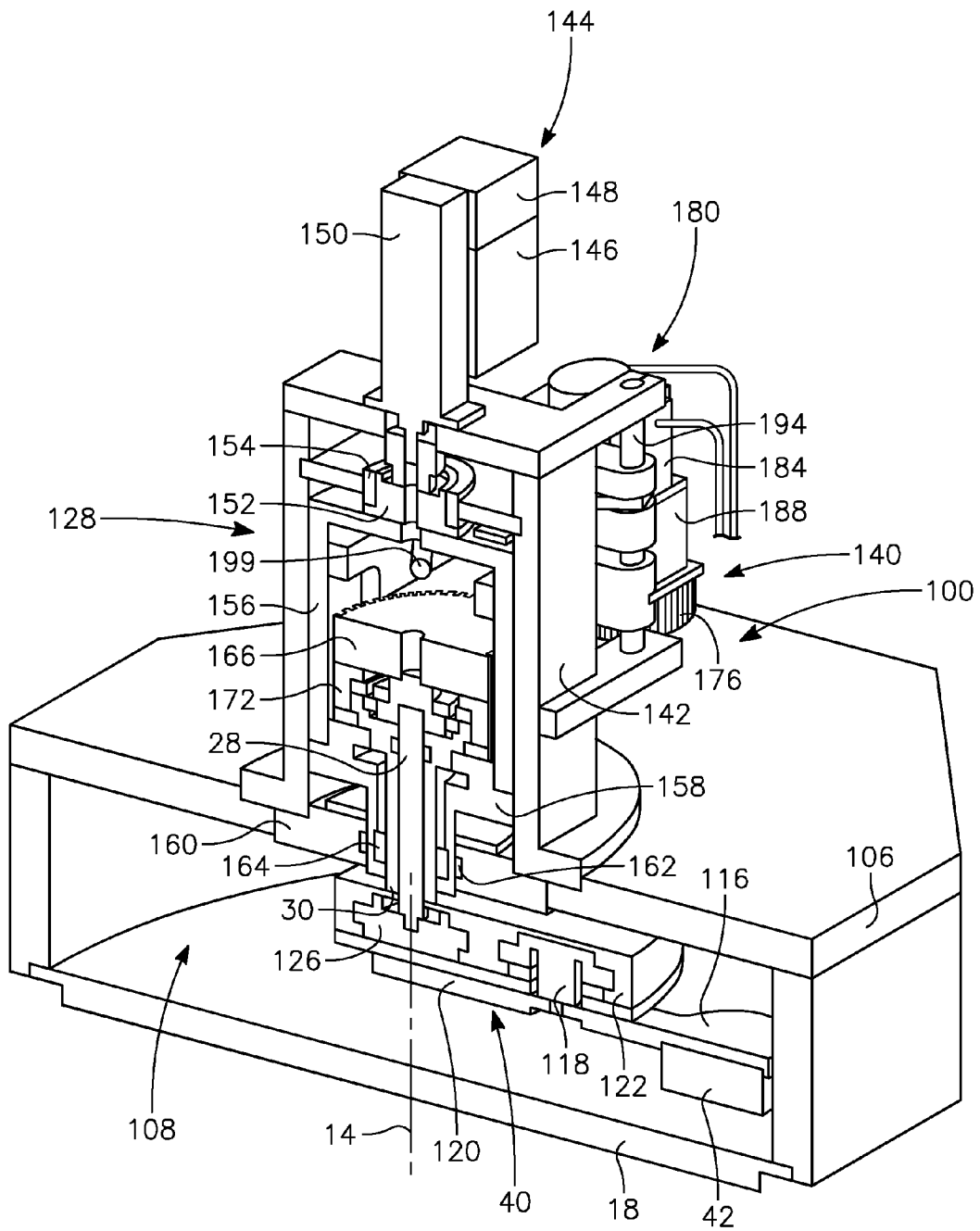
FIG. 3 is a sectioned orthographic view of the source assembly of FIG. 2.

In one embodiment of the invention, a sputter source assembly 100 is illustrated in the full orthographic view of FIG. 2 and the sectioned orthographic view of FIG. 3. The target 18 is supported on and vacuum sealed to the main vacuum chamber 12 of the sputter system 10 and is connected to the DC power supply 80 for exciting the sputter plasma. At least the target's bottom face within the main vacuum chamber 12 is composed of the material to be sputtered, typically a metal, such as copper for a metallization or a refractory metal such as tantalum for a barrier layer. The target layer may be bonded to a backing plate resting on the isolator 22 and exposed to the interior of the cooling reservoir. Other target materials are possible such as a contact metal such as titanium or tungsten or a magnetic material such as GeSbTe. A sputter working gas such as argon is at least initially supplied into the vacuum chamber and, when excited into a plasma, its positively charged ions sputter the negatively biased target 18. The pedestal 72 within the vacuum chamber supports the wafer 70 to be sputter coated in opposition to the target 18. A reservoir frame 104 is sealed to the target 18 but is electrically isolated from it. A lid 106 is sealed to the reservoir frame 104 and they together with the target 102 define a reservoir 108 for a cooling liquid recirculated through the reservoir 108 from an external chiller to cool the target 18 during plasma sputtering.

The epicyclic mechanism 40 driven by the two rotary shafts 28, 30 scans the magnetron 42 located within the reservoir 108 about the back of the target 102. The magnetron 42 projects a magnetic field into the processing space within the vacuum chamber 12 near the sputtering face of the target 18 in order to intensify the sputtering plasma and increase the sputter rate. If the magnetron 42 is small and magnetically strong, it may produce a large fraction of ionized sputtered metal atoms useful for deep hole filling and resputtering of the wafer. In some cases, the ionization fraction and density of the sputtered metal ions are high enough that they form a plasma that may act as the sputtering plasma and the supply of the sputter working gas may be decreased or stopped in a process called self-sustained sputtering (SSS). The magnetron 42 may be round or of other shape and include as previously described an inner pole of one vertical magnetic polarity surrounded by an outer pole of the other polarity and separated from it by an annular gap defining a plasma track adjacent the sputter face of the target 18. Typically, the outer pole and possibly the inner pole are composed of multiple cylindrical magnets. Preferably the outer pole 48 has a larger total magnetic intensity than the opposed inner pole 46. The magnetron 42 may be relatively small in order to concentrate the target power near a small area adjacent the magnetron 42 to thereby further increase the density of the plasma and hence increase the ionization fraction of atoms sputtered from the target 18. The epicyclic mechanism 40 allows two rotary shafts 28, 30 to independently scan the small magnetron 42 both azimuthally (circumferentially) and radially of the central axis 14 of the target 18 and of the source assembly 100. Even rectangular and star-shape scan patterns are possible. Additionally, other mechanisms allow vertical movement of the magnetron 42 to optimize the distance between the magnetron 42 and the back of the target 18, for example to compensate for erosion of the front sputtering face of the target 18. The combination of separable control of rotation, radial positioning, and vertical position allows for universal magnet motion or UMM.

The epicyclic mechanism 40 illustrated in FIG. 3 is a planetary gear mechanism to be described in more detail here. The magnetron 42 is fixed, usually detachably by screws, to the mount 46 of FIG. 2 on one end of an outer arm 116 fixed to a follower gear 118 and a counterweight 120 is supported on the other end of the outer arm 116. The follower gear 118 is rotatably supported on an inner arm 122 formed as a casing to rotatably mount and seal the gears within, and is coupled through an unillustrated idler gear also rotatably supported on the inner arm 122 to a sun gear 126 concentric about the central axis 14. A counterweight may be attached to the inner arm 122 on an opposite side of the epicyclic mechanism 40 from central axis 14. The shafts of the follower gear 118, idler gear, and sun gear 126 in the illustrated embodiment are arranged in a triangular configuration to save space. If at least the follower and sun gears 118, 126 have the same number of teeth, a unity gear ratio causes the rotation rates of the sun gear 126 and the follower gear 118 to be equal. Preferably all three gears have the same number of teeth to simplify inventorying. It is noted that the idler gear is not required and the follower gear 118 may mesh directly with the sun gear 126. On the other hand, there may be more than one intermediate idler gear. Also, other epicyclic mechanisms may be possible.

The inner arm 122 is fixed to the tubular outer rotary shaft 30 of the rotary drive mechanism 128 and the sun gear 126 is fixed to the an inner rotary shaft 28 disposed inside the outer shaft 30. Both rotary shafts 28, 30 are separately rotatable and are concentric with the central axis 14. This design differs from the planetary gear mechanism of U.S. Pat. No. 6,852, 202 in which the inner shaft 28 and hence the sun gear 126 are not rotatable. That planetary mechanism produces planetary motion of the magnetron 42 about the central axis 14, for example, similar to the motion of the moon about the sun. On the other hand, the general epicyclic mechanism of this embodiment can cause the magnetron 42 to move in more complicated patterns more generally defined as epicyclic motion. In general epicyclic motion, the magnetron rotates in circular motion about an offset rotation axis itself rotating in circular motion about the central axis 14 and fixed rotation rates or synchronism between the two rotary movements is not assumed.

The rotary shafts 28, 30 form part of an actuator system 140 including the rotary drive mechanism 128. The actuator system 140 is supported on a derrick 142 supported on and extending above the reservoir lid 106. A vertical actuator 144 mounted on the top of the derrick 142 and including a motor 146, gear box 148, and worm drive 150 has an output shaft 152 sliding through a vertical bushing 154 and connected to a moving frame 156. The vertical actuator 144 operates to vertically move the rotary shafts 28, 30 rotatably supported in the vertically movable frame 156 in tandem along the central axis 14 to compensate for target erosion and for other effects. The vertical movement required for compensating target erosion is relatively small and no more than the thickness of a target tile bonded to a backing plate, for example, about 2 cm or less. In some modes of operation, no compensation is made for erosion of less than 6 mm, but erosion of more than 6 mm benefits from compensation. A typical erosion limit in commercial operation is about 17 mm.

The inner and outer rotary shafts 28, 30 are separately rotatably supported within the moving frame 156 through rotary bearings. A frame stub 158 of the moving frame 156 is sealed to an insert 160 in the reservoir lid 106 through a sliding seal 162 which prevents the cooling water within the reservoir 108 from leaking out but allows the moving frame 156 to move vertically. The lower end of the outer rotary shaft 28 is sealed to the frame stub 158 through a rotary seal 164 to prevent leakage of the cooling water while allowing the outer rotary shaft 28 to rotate. The inner rotary shaft 30 rotates within a sealed water-free region. Its primary seal is a dynamic seal between the casing of the inner arm 122 and the output shaft of the follower gear 118 supporting and rotating the outer arm 116. However, a backup seal is located at the top of the inner rotary shaft 30 just below its support bearing.

Figure 4:
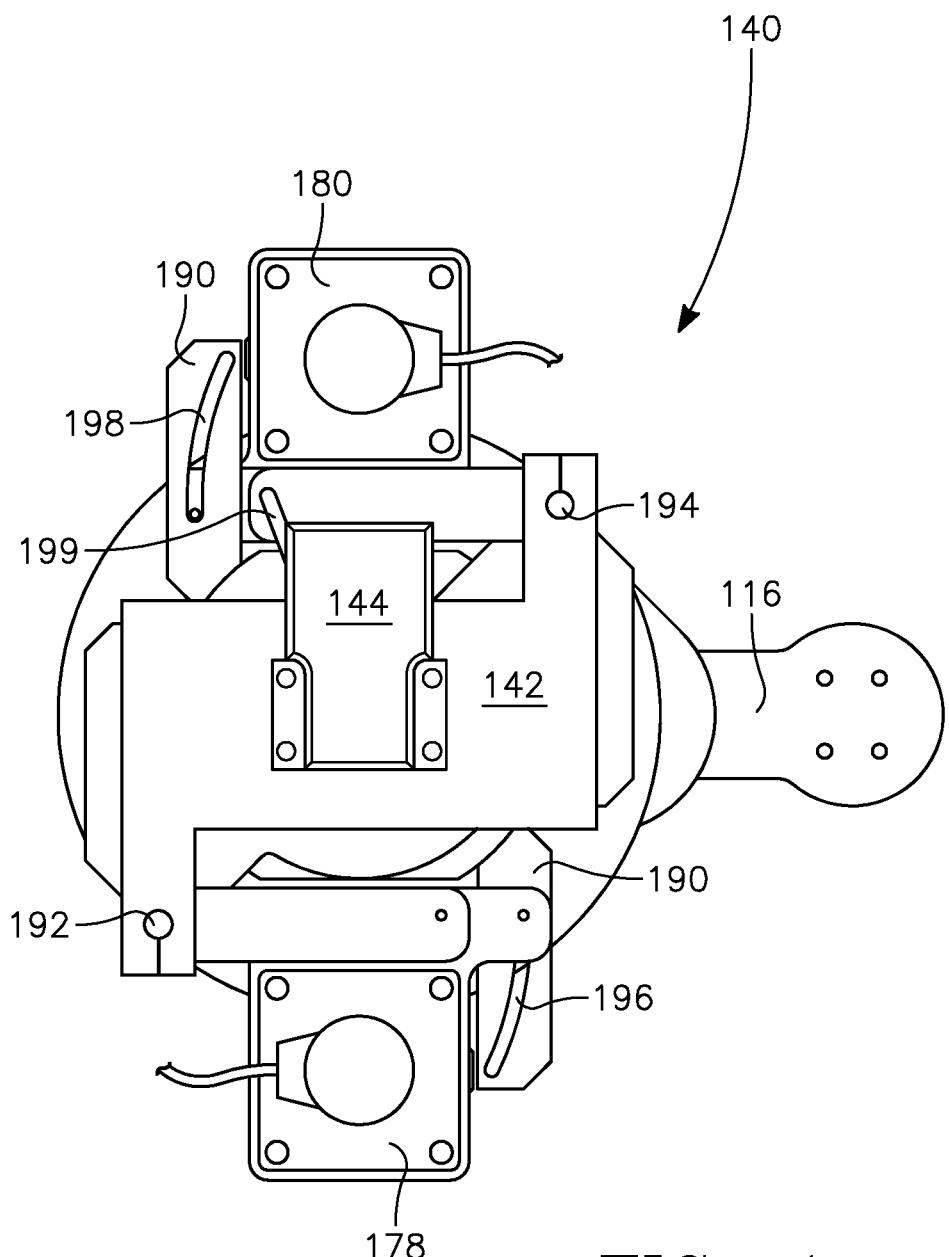
FIG. 4 is a plan view of the actuators and epicyclic mechanism of the source assembly of FIG. 2.

An upper input pulley 166 is fixed to the inner rotary shaft 30 and a lower input pulley 172 is fixed to the outer rotary shaft 28. Both pulleys 170, 172 are concentric with the central axis 14, have ribbed or toothed surfaces to engage with unillustrated ribbed belts engaged with ribbed output pulleys 174, 176 of two rotary actuators 178, 180 (see FIG. 2) including respective motors 182, 184 and gearboxes 186, 188 all supported on the frame 156. The motors 182, 184 are preferably servo motors which enable synchronized movement of the two rotary shafts 28, 30. However, the motors 182, 184 may be driven by separate, nearly arbitrary drive signals so that they can be moved independently if desired. As illustrated in FIG. 2 and the top plan view of FIG. 4, the rotary actuators 178, 180 are supported on a motor carriage 190 fixed to the moving frame 156 but are guided by vertical guide rods 192, 194 fixed to the derrick 142. Thereby, the rotary actuators 178, 180 move up and down with the vertical actuator 148 and their motors 182, 184 are powered by flexible electrical cables. The actuators 178, 180 can pivot about the guide rods 192, 194 with guide pins extending through arcuate slots 196, 198 in the motor carriage 190 to allow servicing and installation of the belts but during operation the actuators 178, 180 are coupled together by a tightenable tension rod 199 so their belts share the tension. The pulleys and belts could be replaced by other types rotary members such as gears intermeshed with each other.

The two coaxial rotary drive shafts 28, 30 allow nearly arbitrary motion of the magnetron about the back of the target. If the inner rotary shaft 28 is held stationary, the 1:1 gear ratio of the described embodiment produces a nearly parabolic repetitive scan path with a single lobe. If the inner and outer rotary shafts 28, 30 rotate together in synchronism, the magnetron traces a circular path. The radius of rotation depends upon the phase difference between the notations of the two rotary shafts 28, 30. This operation may be useful for some types of highly ionized sputtering from refractory targets such as tantalum in which the outer periphery is the primary sputtering area but the inner portion needs to be cleaned of redeposited material. During the sputter deposition, the phase is selected to position the magnetron near the periphery. During the center cleaning, the phase is adjusted to position the magnetron near the center.

Figure 5:
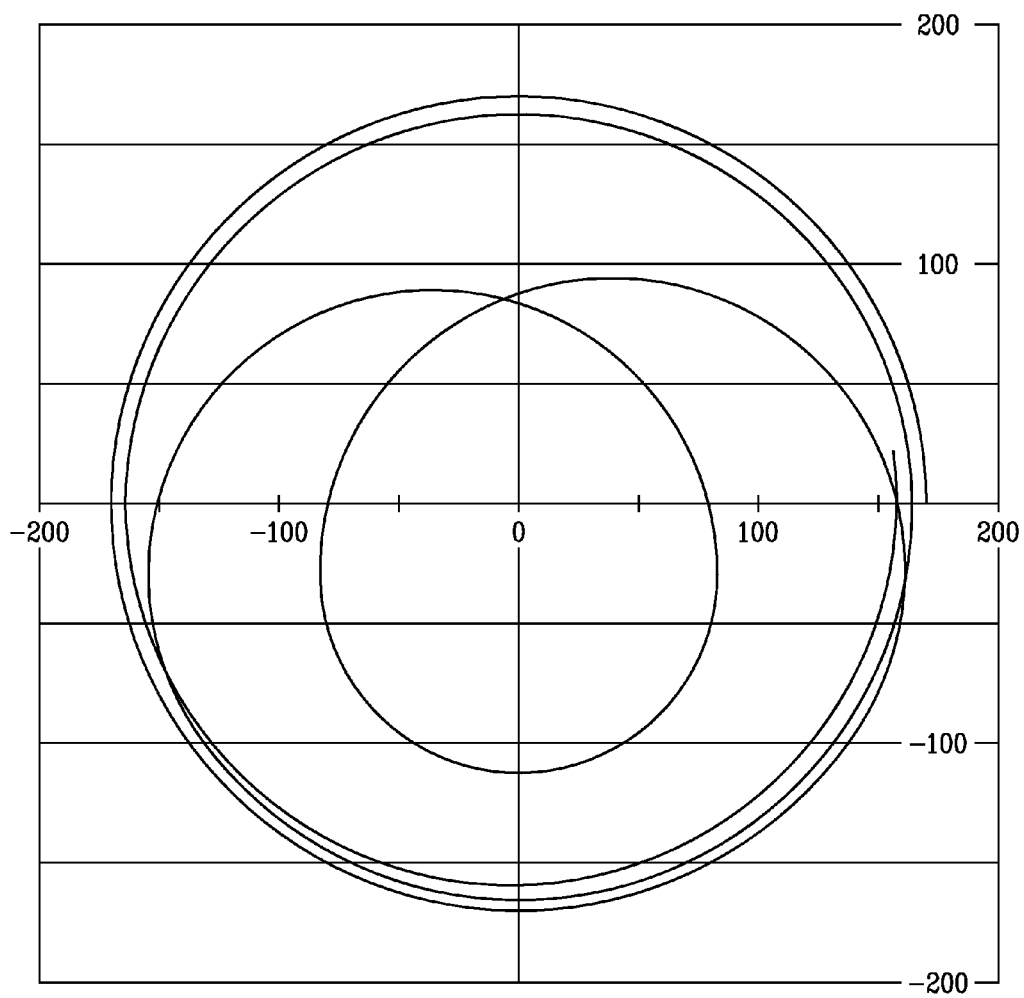
FIG. 5 is a map of a one scanning pattern achievable with the source assembly of FIG. 1 in units of millimeters from the target center.
Figure 6:
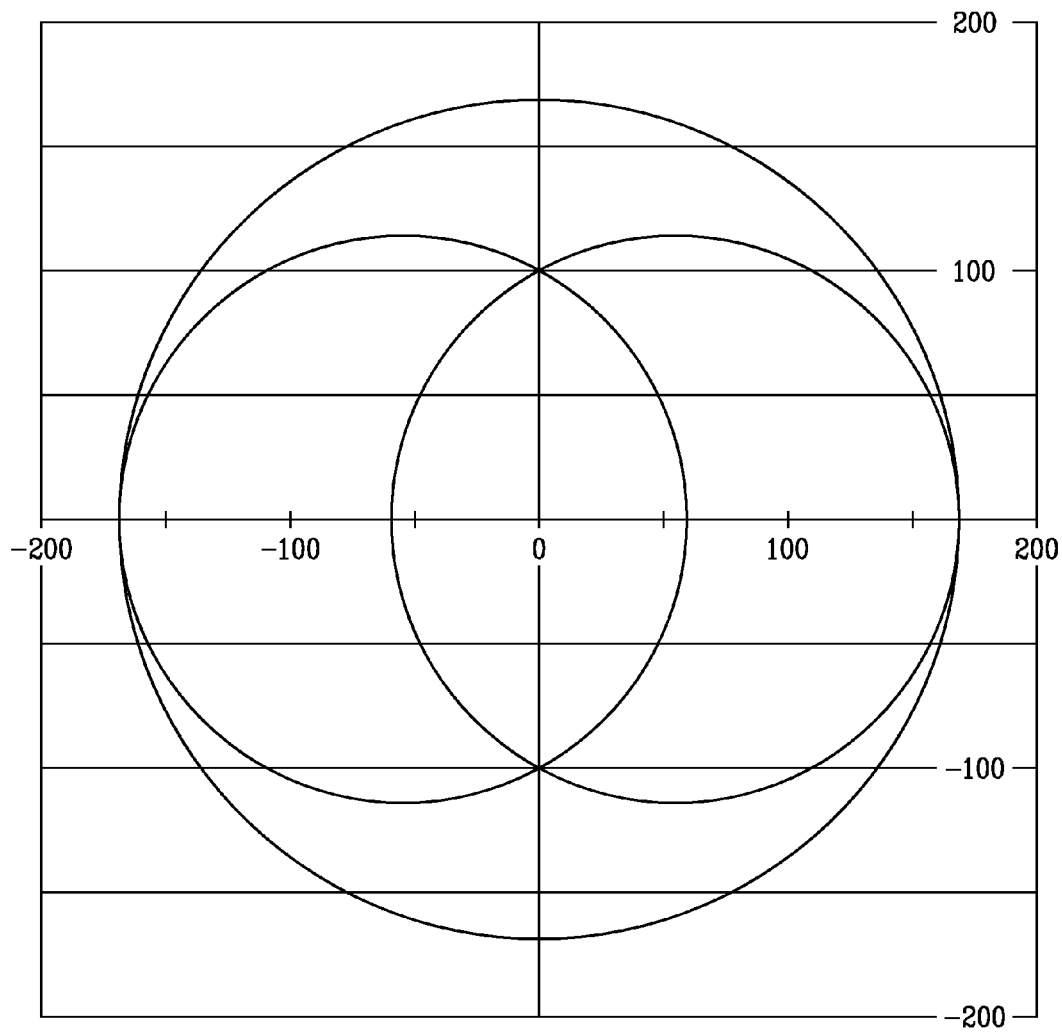
FIG. 6 is a map of another scanning pattern.

If the two rotary shafts 28, 30 rotate at different rates, a more complicated scan pattern results, similar to a planetary pattern but more generally defined as an epicyclic pattern. Variations in the difference of rotation rates changes the number of lobes. However, the rotation rates need not be constant over a scan period. For example, an advantageous scan pattern for sputter depositing a copper seed layer is illustrated in the map of FIG. 5. The seed layer to be deposited is relatively thin so the entire scan for the deposition may take only a few seconds in comparison to a typical magnetron rotation rate of about 60 rpm (1 sec per rotation). Due to both geometrical effects and diffusion of sputtered ions, most of the sputtering should be performed near the target periphery at a fairly constant though slightly decreasing radius. However, in the middle of the scan, the magnetron is scanned near the target center to even erosion and reduce radial anisotropy as well as to clean the target center of redeposited sputtered material. Thereafter, the magnetron is again scanned near the target periphery. Another scan pattern illustrated in the map of FIG. 6 includes one or more generally circular passes near the target periphery about the target center and two smaller circular or possibly oval or elliptical passes mirrored about a target diameter and emphasizing center sputtering.

Figure 7:
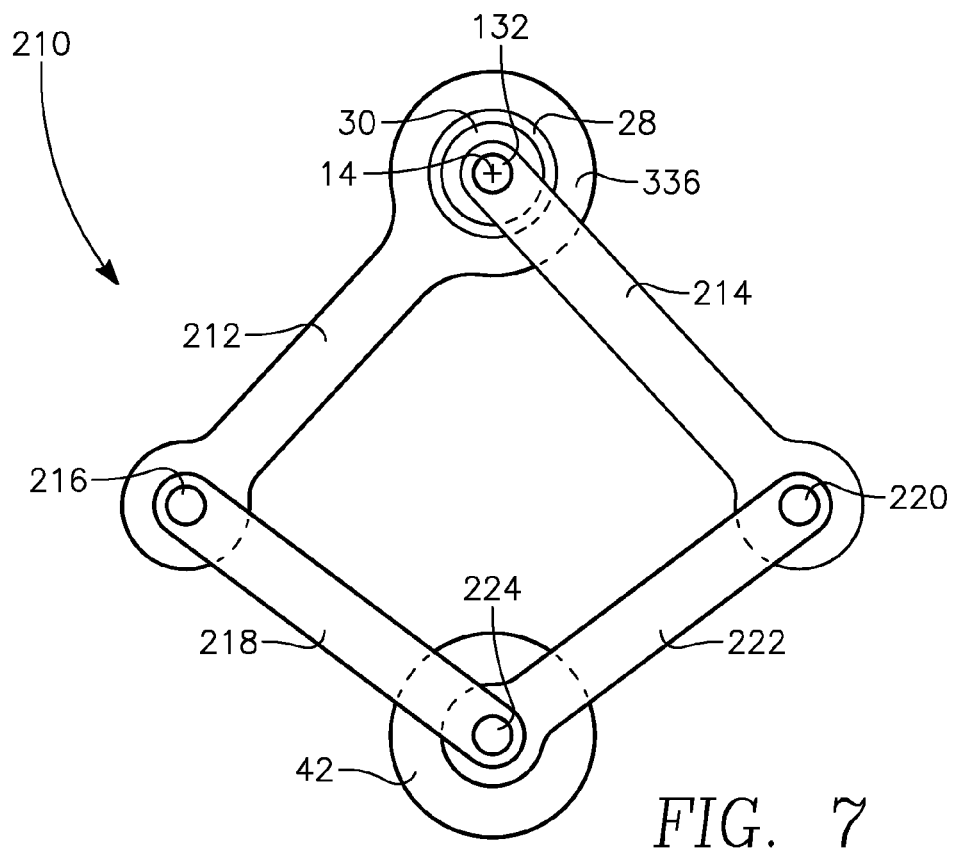
FIG. 7 is a top view of a frog-leg mechanism which may be substituted for the epicyclic mechanism.

Another embodiment replaces the planetary gear mechanism with a frog-leg mechanism 210 illustrated in a partially sectioned plan view in FIG. 7 and which is similar to that disclosed by Miller et al. in the above cited application. A first inner arm 212 is fixed to the bottom of the tubular outer rotary shaft 28 and a second inner arm 214 is fixed to the bottom of the inner rotary shaft 30. A first pivot joint 216 pivotally connects the first inner arm 212 to a first outer arm 218 and a second pivot joint 220 pivotally connects the second inner arm 214 to a second outer arm 222. In this embodiment, a third pivot joint 224 pivotally connects the first and second outer arms 218, 222 and generally supports the magnetron 42 through a mount.

As the rotary shafts 28, 30 rotate in opposite directions, the frog-leg mechanism 210 projects or retracts the magnetron 42 relative to the central axis 14. As the rotary shafts 28, 30 rotate in the same direction, the frog-leg mechanism 210 rotates the magnetron 42 about the central axis 14. Clearly the radial and azimuthal motions can be combined by variable differential control of the two rotary shafts 28, 30. If the magnetron 42 is circular, it may be mounted on one or the other of the arms 218, 222 while producing the same magnetic field distribution at any radius. If the magnetron 42 is arc-shaped or otherwise non-circular, means are available either to vary the orientation across the radial range or to maintain it across the radial range, such as an intermediate mount rotatably coupled at different points to the arms 218, 222 and replacing the simple joint 224.

Figure 8:
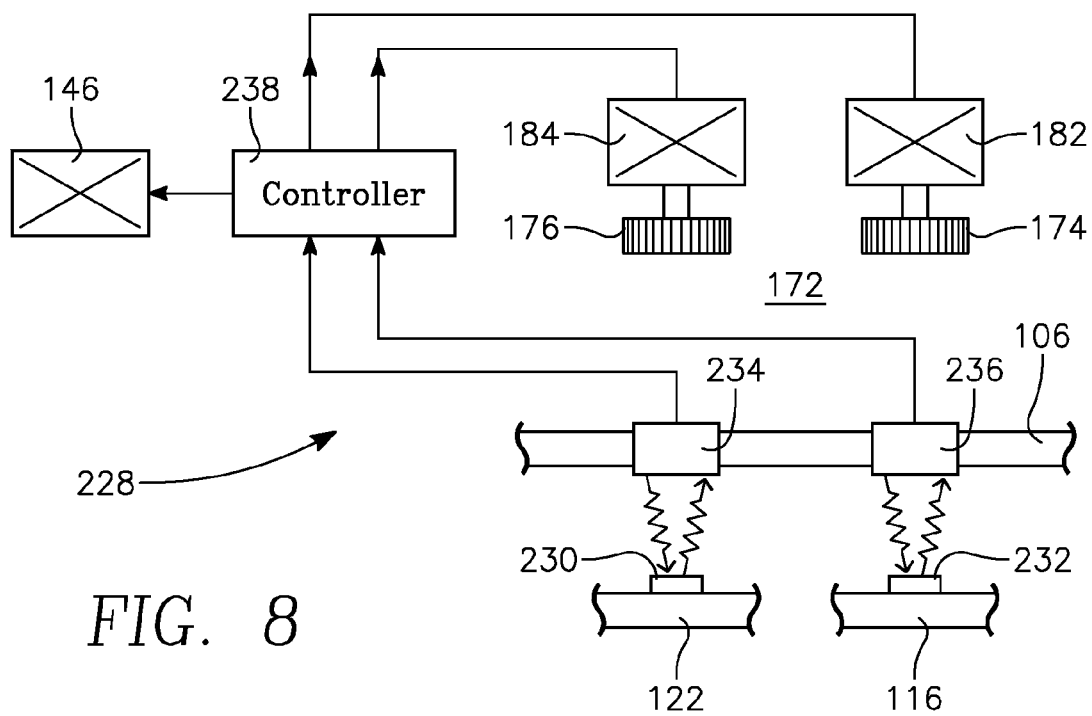
FIG. 8 is a schematic diagram of a control circuit for controlling and homing an epicyclic mechanism.

The coaxial rotary shafts 28, 30 of the two described embodiments require synchronized control of their rotational movements because the radial and circumferential positioning of the magnetron depend upon both of their rotational rates. First of all, at the start up of the actuator system 144, the two rotary actuators 178, 180 need to be homed by the electronic controller. Referring the schematic diagram of FIG. 8, a homing system 228 can include a first polarized reflector 230 attached to the top of the inner arm 122 of FIG. 3 at its outer extent and a second polarized reflector 232 attached to the top of the outer arm 116 at its outer extent near the magnetron 42. First and second optical emitter/sensors 234, 236 pierce the reservoir lid 106 and are placed at radial positions relative to the central axis 14 corresponding to the radius of the first reflector 230 and the radius of the second reflector 232 when the magnetron 102 is at its maximum radius. That is, the radius of the second optical emitter/sensor 236 equals the sum of the distance between the central axis 14 and the center of the follower shaft 118 and the distance between the center of the follower shaft 118 and the position of the second optical emitter/sensor 236 on the outer arm 116. Each emitter/sensor 234, 236 emits a collimated polarized beam and detects when the beam is reflected from the respective polarized reflector 230, 232 positioned directly under the emitter/sensor 234, 236. The polarizations of the collimated beams and of the reflectors 230, 232 are matched so that a regular or shiny metal surface is much less effective at reflecting the collimated beam than the reflectors 230, 232. Advantageously, the sensors employ polarization filters to pass only the polarization of the associated homing beam. Cross polarization between the two homing beams prevents the incorrect reflector 230, 232 from being detected. The polarizations may be two perpendicular linear polarizations. Quarter-wave plates may be advantageously used. Alternatively, two magnetic sensors may detect or interact with magnets mounted on the two arms 116, 122. Conveniently, the sensor positions are aligned along a common radius of the target.

In the homing operation prior to production operation, a controller 238, which may be part of chamber controller 88 of FIG. 1, controls the first rotary motor 184 to cause the outer rotary shaft 230 to slowly rotate the inner arm 122 until the controller 238 detects that the first reflector 230 is under the first emitter/sensor 234. The controller 238 then stops the outer rotary shaft 230 and controls the second rotary motor 182 to cause the inner rotary shaft 30 to slowly rotate the sun gear 126 and hence the outer arm 116 until the controller 238 detects that the second reflector 232 is under the second emitter/sensor 236. The thus established positions of the inner and outer arms 122, 116 and associated rotary motors 182, 184 are the home positions and the controller 238 must thereafter control the rotary motors 182, 184 in synchronism to effect the desired magnetron path. Any belt slippage or missed control periods during operation would degrade the synchronism and require rehoming. The controller 238 additionally controls the motor 146 for the vertical actuator.

Figure 9:
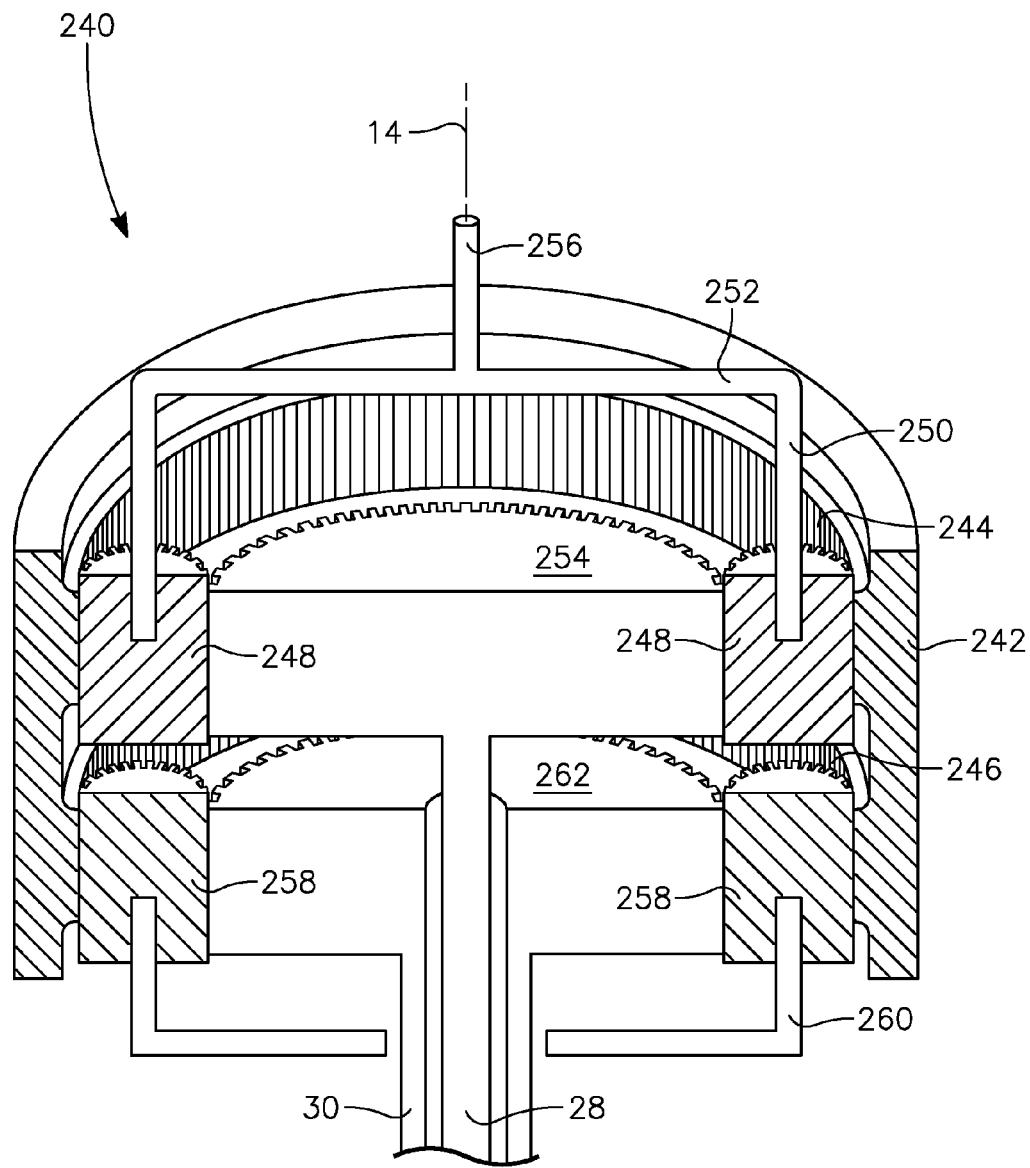
FIG. 9 is a sectioned orthographic view of a ring-gear mechanism usable in controlling the radial and azimuthal scanning of a magnetron.

Another rotary drive mechanism 240 schematically illustrated in the sectioned side view of FIG. 9 includes a ring gear 242 arranged around the central axis 14 and having upper and lower internally toothed annular surfaces 244, 246. The outer rotary motor rotates the ring gear 242 about the central axis 14. At least one upper idler gear 248 rotates on a respective shaft 250 attached to an epicyclic carrier 252 and extending parallel to but separated from the central axis 14 and couples the rotation of the ring gear 242 to an upper sun gear 254 fixed to an upper end of the inner rotary shaft 28. The shaft 250 of the epicyclic carrier 252 is connected through a fork structure to an input shaft 256 extending along the central axis 14. The inner rotary motor is connected to the input shaft 256 and rotates it and the upper idler gear 248 about the central axis 14 to orbit it and the upper idler gear 248 orbit about the central axis 14. The upper idler gear 248 also couples the rotation of the epicyclic carrier 252 to the upper sun gear 254 and thence to the inner rotary shaft 28. Similarly, at least one lower idler gear 258 rotates on a respective fixed shaft 260 and couples the rotation of the ring gear 242 to a lower sun gear 262 fixed to the outer rotary shaft 30. There may be a single upper idler gear 248 and a single lower idler gear 258; however, two or three of each provide a more mechanically robust system. Either the epicyclic mechanism 40 of FIG. 3 or the frog-leg mechanism 210 may be connected to the lower ends of the rotary shafts 28, 30 to scan the magnetron 42 in a generalized epicyclic pattern.

The gear system of FIG. 9 can be modified by fixing the ring gear 242 to the outer rotary shaft 30 but a two-stage idler should replace the other idler gear 248 to maintain the same rotary directions. It is also appreciated that with suitable redesign, the orbiting and rotating idler gear 248 may couple the ring gear 2442 to the outer rotary shaft 30.

In typical operation assuming that the epicyclic carrier 252 is stationary, the principal circumferential motion of the magnetron is controlled by the rotation of the ring gear 242 through the upper and lower sun gears 254, 262 On the other hand, the radial motion of the magnetron is controlled by epicyclic carrier 252. That is, the epicyclic carrier 252 determines the phase between the rotary shafts 28, 30. The result is a differential drive mechanism in which the rotary motion is mostly decoupled from the radial motion. The decoupling is most pronounced in the frog-leg mechanism for which the position of the epicyclic carrier 252 has a substantially one-to-one correspondence to the radial position of the magnetron since the frog-leg mechanism limits the phase difference between the rotary shafts 28, 30. However, in the epicyclic mechanism the direction of the radial position of the magnetron is a repeating function of the cumulative rotation of the epicyclic carrier 252 but the differential drive may be limited to finite range. In any case, the ring-gear design removes the requirement for synchronized drive motors.

The schematically illustrated actuator of FIG. 9 could be incorporated inside the vertically movable frame of 156 of FIG. 2 to provide the desirable vertical movement of the magnetron.

Other differential drive mechanisms are described in US patent application publication 2006/0076232.

The invention thus provides a nearly arbitrary scanning pattern of the magnetron about the back of sputtering target. Further, the scanning patterns may be varied by software control of the motors driving the rotary shafts without the need to substitute gears or support arms. The generality is available with a modest increase in complexity of the mechanical system.

The invention claimed is:

1. A homing device for a rotating magnetron including an inner arm pivotable about a central axis and an outer arm pivotable about an offset axis on the inner arm spaced from the central axis, wherein angular positions of the inner and outer arms about the offset axis and central axis respectively can be separately controlled during rotation of the magnetron, comprising:
   a first reflector affixed to the inner arm;
   a first light emitter configured to irradiate the first reflector with a first light beam;
   a first light detector detecting light of the first light beam reflected from the first reflector;
   a second reflector affixed to the outer arm;
   a second light emitter configured to irradiate the second reflector with a second light beam; and
   a second light detector detecting light of the second light beam reflected from the second reflector.

2. The homing device of claim 1, wherein the first light beam has a first polarization and the second light beam has a second polarization different from the first polarization.

3. The homing device of claim 2, wherein the first polarization is a linear polarization and the second polarization is a linear polarization perpendicular to the first polarization.

4. The homing device of claim 2, wherein the reflectors comprise polarized reflectors.

5. The homing device of claim 2, wherein the light detectors include respective polarization filters.

6. A homing device for a rotating magnetron including an inner arm pivotable about a central axis and an outer arm pivotable about an offset axis on the inner arm spaced from the central axis, comprising:
   a first reflector affixed to the inner arm;
   a first light emitter configured to irradiate the first reflector with a first light beam;
   a first light detector detecting light of the first light beam reflected from the first reflector, wherein the first emitter, first reflector, and first light detector are disposed at a first radius from the central axis;
   a second reflector affixed to the outer arm, wherein the second reflector is disposed at a second radius from the central axis when the outer arm is maximally extended from the central axis;
   a second light emitter configured to irradiate the second reflector with a second light beam; and
   a second light detector detecting light of the second light beam reflected from the second reflector, wherein the second emitter and second light detector are disposed at the second radius from the central axis.

7. A position sensing device for a magnetron system magnetron including an inner member rotatable about a central axis and an outer member pivotable about a pivot axis on the inner member spaced from the central axis and supporting a magnetron, comprising:
   a first sensed object disposed on the first member;
   a second sensed object disposed on the second member;
   a first sensor disposed closer to the first axis than the second axis to detect the presence of the first sensed object; and
   a second sensor disposed radially farther from the first axis than the second axis and to detect the presence of the second sensed object.

8. The position sensing device of claim 7, wherein the first and sensed objects comprise magnets and the first and second sensors comprise magnetic sensors.

9. The sputter chamber of claim 7, wherein the first and second sensed objects comprise respective first and second optical reflectors and the first and second sensors comprise respective first and second optical emitters and first and second optical detectors.

10. A sputter chamber, comprising:
    a vacuum chamber;
    a target disposed on a side of the vacuum chamber in opposition to a substrate to be processed;
    a magnetron chamber disposed on a side of the target opposite the substrate;
    a magnetron assembly disposed on a side of the target opposite the substrate and including
        a first arm rotatable about a first axis,
        a second arm pivotable about a second axis on the first arm displaced from the first axis, and
        a magnetron supported on the second arm away from the second axis;
    a first sensed object disposed on the first arm;
    a second sensed object disposed on the second arm;
    a first sensor disposed closer to the first axis than the second axis and facing the target to detect the presence of the first sensed object; and a second sensor disposed radially farther from the first axis than the second axis and facing the target to detect the presence of the second sensed object.

11. The sputter chamber of claim 10, further comprising a vertical actuator capable of moving the first arm, the second arm, and the magnetron in a direction parallel to the first axis.

12. The sputter chamber of claim 10, wherein the first and sensed objects comprise magnets and the first and second sensors comprise magnetic sensors.

13. The sputter chamber of claim 10, wherein the first and second sensed objects comprise respective first and second reflectors and the first and second sensors comprise respective first and second optical emitters and first and second optical detectors.

14. The sputter chamber of claim 13, wherein the first optical emitter emits a first beam of light of a first polarization and the second optical emitter emits a second beam of light of a second polarization different from the first polarization.

15. The sputter chamber of claim 14, wherein the first optical sensor includes a first polarizer passing light of the first polarization and the second optical sensor includes a second polarizer passing light of the second polarization.

16. The sputter chamber of claim 15, wherein the first reflector comprises a polarized reflector having a polarization matched to the first polarization and the second reflector comprises a polarization reflector having a polarization matched to the second polarization.

17. The sputter chamber of claim 16, wherein the first optical detector has a first polarization filter to pass light of the first polarization and the second optical detector has a second polarization filter to pass light of the second polarization.

18. The sputter chamber of claim 10, further comprising a controller including
first means for causing the first arm to rotate about the first axis until the first sensor senses the first sensed object and in response thereto for stopping rotating the second arm; and
second means responsive to sensing of the first sensed object for cause causing the second arm to pivot about the about until the second sensor senses the second sensed object to thereby establish rotational positions of the first and second arms.

19. A control mechanism for controlling the movement of a magnet assembly in a sputter chamber, comprising:
a magnet assembly;
a scanning mechanism including a first arm rotatable about a central axis and a second arm mounted on the first arm and rotatable about a pivot axis located on the first arm and supporting the magnet assembly at a position on the second arm thereby allowing azimuthal and radial movement of the magnet assembly about the central axis;
two motors differentially and mechanically coupled to the two arms;
a first reflector disposed on the first arm and a second reflector disposed on the second arm away from the pivot axis;
a first optical sensor positioned at a first radial distance from the central axis and operatively associated with the first reflector;
a second optical sensor positioned at a second radial distance from the central axis different than the first radial distance and operatively associated with the second reflector; and
a controller responsive to outputs of the first and second optical sensors and controlling the two motors to control relative angular positions of the first and second arms.

20. The control mechanism of claim 19, wherein the first and second optical sensors are used to home the positions of the first and second arms prior to execution of the selected one of the paths.

21. A sputter system, comprising:
a vacuum chamber arranged about a central axis, including a pedestal for supporting a substrate to be processed, and configured to be fit with a sputter target assembly having a front face including sputter material in opposition to the pedestal;
a magnet chamber finable to a the target assembly and including a top wall facing a back face of the target;
a magnet assembly;
a scanning mechanism accommodated in the magnet chamber for scanning the magnet assembly about the back side of the target assembly in radial and azimuthal directions about the central axis and including an inner member rotating about the central axis and an outer member supported on and totaling about a pivot axis on the inner member, wherein the pivot axis is displaced from the central axis and the magnet assembly is supported on the outer member;
a first reflector mounted on the inner member;
a first optical sensor mounted on the top wall at a first radius from the central axis and capable of detecting the presence of the first reflector;
a second reflector mounted on the outer member; and
a second optical sensor mounted on the top wall at a second radius from the central axis different than the first radius and capable of detecting the second reflector.

22. The sputter system of claim 21, further comprising:
first and second motors driving the scanning mechanism to effect the movement of the magnet assembly in the radial and azimuthal directions; and
a controller responsive to the first and second optical detectors and separately controlling the first and second motors and including a homing procedure to home the positions of the inner and outer member.

* * * * *